United States Patent
Yang

(10) Patent No.: US 10,591,560 B2
(45) Date of Patent: Mar. 17, 2020

(54) RADIO FREQUENCY (RF) TRANSMIT SYSTEM FOR DIGITAL RF CURRENT SOURCE

(71) Applicant: Quality Electrodynamics, LLC, Mayfield Village, OH (US)

(72) Inventor: Xiaoyu Yang, Indiana, PA (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 281 days.

(21) Appl. No.: 15/708,620

(22) Filed: Sep. 19, 2017

(65) Prior Publication Data

US 2018/0081004 A1 Mar. 22, 2018

Related U.S. Application Data

(60) Provisional application No. 62/397,519, filed on Sep. 21, 2016.

(51) Int. Cl.
*G01R 33/36* (2006.01)
*H03F 3/217* (2006.01)
*G01R 33/3415* (2006.01)

(52) U.S. Cl.
CPC ..... *G01R 33/3614* (2013.01); *G01R 33/3607* (2013.01); *H03F 3/217* (2013.01); *H03F 3/2175* (2013.01); *G01R 33/3415* (2013.01); *G01R 33/3628* (2013.01)

(58) Field of Classification Search
CPC .................. G01R 33/3614; G01R 33/3607
See application file for complete search history.

(56) References Cited

U.S. PATENT DOCUMENTS

| | | | |
|---|---|---|---|
| 5,442,290 A * | 8/1995 | Crooks | G01R 33/3852 324/309 |
| 2008/0231282 A1* | 9/2008 | Griswold | G01R 33/3415 324/322 |
| 2017/0299671 A1* | 10/2017 | Holle | G01R 33/34076 |
| 2017/0359034 A1* | 12/2017 | Hussein | H03F 1/56 |
| 2018/0238975 A1* | 8/2018 | Leussler | G01R 33/3607 |
| 2018/0252783 A1* | 9/2018 | Jones | G01R 33/3657 |
| 2019/0101608 A1* | 4/2019 | Zheng | G01R 33/5617 |

\* cited by examiner

*Primary Examiner* — Christopher E Mahoney
(74) *Attorney, Agent, or Firm* — Eschweiler & Potashnik, LLC

(57) ABSTRACT

Example embodiments include a radio frequency (RF) transmit system for a digital RF current source, the system including a magnetic resonance imaging (MRI) system control console operably connected to at least one digital RF current source amplifier. The at least one digital RF current source amplifier is operably connected to an RF transmission coil. The MRI system control console provides a digital control signal to the at least one digital RF current source amplifier. The MRI system control console provides a master RF current source clock signal to the at least one digital RF current source amplifier. The digital RF current source amplifier provides an alternating current to the RF transmission coil.

34 Claims, 12 Drawing Sheets

RADIO FREQUENCY (RF) TRANSMIT SYSTEM FOR DIGITAL RF CURRENT SOURCE

REFERENCE TO RELATED APPLICATION

This Application claims priority to U.S. Provisional Application No. 62/397,519 filed on Sep. 21, 2016, the contents of which are hereby incorporated by reference in their entirety.

BACKGROUND

In magnetic resonance imaging (MRI) scanners the magnetic field B strongly varies based on the coil resistance. Coil resistance may be affected by patient load, and reactance, which is affected by off-resonance. In conventional MRI systems, time consuming power adjustments and tuning are required to correct for changes in the impedance of the transmission coil. If not properly adjusted, the off-resonance caused therefrom may yield negative effects on multi-slice imaging, on off-center imaging, and may cause other image quality degradation issues.

MRI radio frequency (RF) coils create the $B_1$ field that rotates the net magnetization in a pulse sequence. RF coils may also detect precessing transverse magnetization. The difference in energy between the two orientations for the nuclei subjected to the $B_0$ and $B_1$ fields depends on the type of atom and the strength of the $B_0$ field. Higher strength $B_0$ fields may produce an increased signal to noise ratio (SNR) but may also cause other issues. For instance, increasing the $B_0$ field strength increases the energy differential between the two orientations but requires more RF energy to induce the transition between the orientations, which in turn increases the frequency of the RF signal required to produce a $B_1$ field. For example, RF energy applied at a frequency of approximately 64 MHz is used to bring a hydrogen nucleus into resonance in a 1.5 T $B_0$ field while RF energy applied at a frequency of approximately 300 MHz is used to bring the same hydrogen nucleus into resonance in a 7 T $B_0$ field.

Coils may be used for transmitting RF energy that is intended to cause nuclear magnetic resonance (NMR) in a sample. The frequency at which NMR will be created depends on the magnetic field present in the sample. Both the main magnetic field $B_0$ produced by the MRI apparatus and the additional magnetic field $B_1$ produced by a coil contribute to the magnetic field present in the sample. For a circular loop coil, the transmit $B_1$ field equals the coil sensitivity. A circular loop of radius a carrying a current I produces on axis the field: $B=\mu_0 I a^2/[2(a^2+z^2)^{3/2}]$.

An imaging coil needs to be able to resonate at a selected Larmor frequency. Imaging coils include inductive elements and capacitive elements. The resonant frequency, v, of an RF coil is determined by the inductance (L) and capacitance (C) of the inductor capacitor circuit (e.g. LC circuit) according to:

$$v = \frac{1}{2\Pi\sqrt{LC}}$$

Positioning coils in a transmit array may produce a more uniform $B_1$ field. However, transmit arrays produce additional problems. For example, to produce a uniform $B_1$ field it may be necessary to control the current flowing through each coil of the array. However, an RF pulse is defined by a voltage level input to an amplifier and thus unique loading of different coils in the transmit array may lead to different currents on the different coils. Different coils may experience unique loading due, for example, to different properties in different tissues being imaged and the proximity of the different coils to those different tissues Additionally, RF coils for MRI may need to be tuned and matched. Tuning involves establishing or manipulating the capacitance in a coil so that a desired frequency is produced. Matching involves establishing or manipulating the resistance in a coil so that a desired resistance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The matching can then be adjusted to produce the desired resistance. Once the desired resistance is achieved, then the coil and its driver are power matched.

A conventional loop coil has elements that produce a resistance (e.g., coil copper trace and the coil loading) and that produce an inductance (e.g., copper trace). A conventional loop coil may include a matching capacitor and a tuning capacitor. Conventionally, the resistor, inductor, and capacitor may all have been two terminal passive elements that were soldered to copper wire or copper foil that was attached to a printed circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
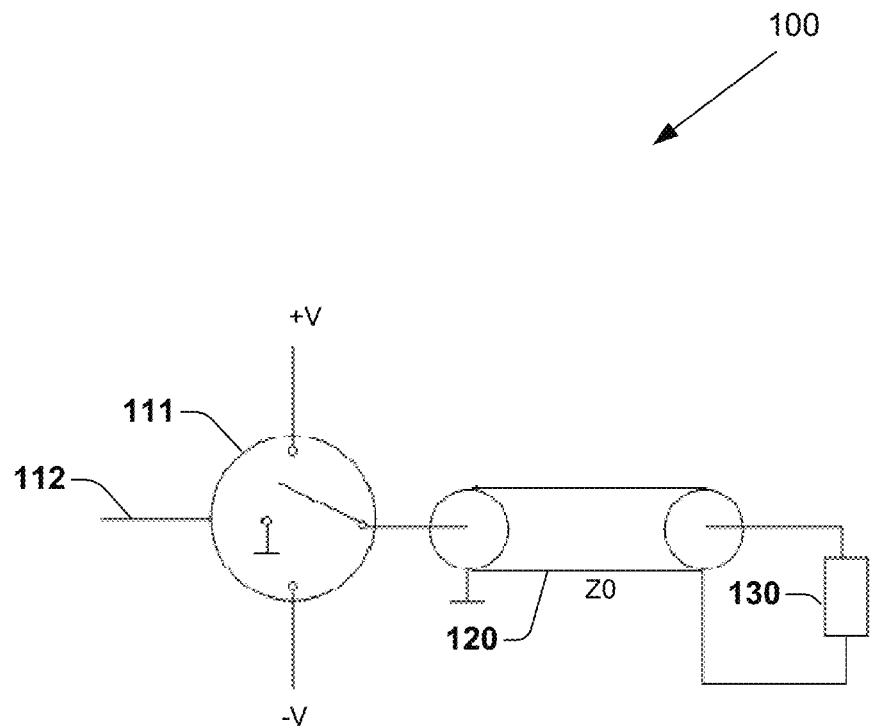
FIG. 1 illustrates an embodiment of a digital RF current source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

There are a number of disadvantages to conventional magnetic resonance imaging (MRI) systems. First, conventional MRI systems require time consuming MRI radio frequency (RF) transmitter power adjustments and impedance tuning that depend on patient size. Second, there may be imaging issues in multi-slice image sequencing due to the different slices resonating at different frequencies. Third, the reported specific absorption rate (SAR) may not be accurate at low flip angles (for example, at a very small RF output) due to low RF efficiency and inaccurate power readings from the amplifier.

Embodiments described herein employ fully digital RF coil current source amplifiers in an MRI system to mitigate or eliminate these issues. In some embodiments a digital RF current source amplifier may control an RF current source in an MRI apparatus using a class D amplifier operably connected to a transmit coil. Compared to conventional RF transmit (Tx) coils and amplifiers this approach yields a safer and more efficient MRI scanner.

Properties of the Tx coil, for example impedance, may change based on the size of a patient or size of a subject being imaged. In conventional MRI systems, the impedance of the Tx coil must therefore be matched to the impedance of the transmission line as the size of the patient or size of the subject being imaged changes. If the impedance matching is not done or is not accurate, a large amount of RF power may be reflected back at the coil-transmission line interface instead of being transmitted into the patient. This may cause noisy images, poor contrast, and other adverse effects. In conventional systems, the ratio of forward-to-reflected power of the RF power amplifiers must be determined and system properties must be adjusted in order to match the system. This may be a time-consuming process.

In an MRI system that uses conventional 50 Ohm RF power amplifiers, the RF power must be searched to determine the correct flip angle and to determine if the matching conditions have changed. This costs the system valuable scanner time and loss of additional power. Example embodiments use a class D amplifier electrically coupled to the transmit coil by a transmission line that may have a length of a quarter wavelength or odd number multiple of quarter wavelengths (e.g., 1/4, 3/4, 5/4, . . . ) of the RF signal wavelength, including odd integer multiples of λ/4. Therefore, in example embodiments, the current flowing through the coil is independent from the load as the RF current sources act as the RF amplifiers. As a result no RF power search is required.

For a multi-slice sequence the different slices resonate at different frequencies. Because a conventional Tx coil is a fixed resonant coil, i.e., it resonates only at one frequency, the conventional Tx coil will have a significant reactive load at slices that are not at the working frequencies. In conventional systems, if there is, for example, perfect matching (50 Ohm) at the working frequency, then at 200 KHz away the reactive impedance could be significant compared to the 50 Ohm impedance, i.e., 50 Ohm+/−jxx. Therefore, there will be different magnetic field magnitudes between the 50 Ohm impedance and the 50 Ohm+/−jxx impedance because the impedance matching at the two frequencies is substantively different. Thus, in this situation, the flip angles between slices will not be the same. In conventional systems, there is no solution to address this problem using conventional 50 Ohm RF power amplifiers because conventional systems rely on impedance matching. Embodiments described herein use digital RF current source amplifiers at the transmit coil, and therefore the currents (and the corresponding B magnetic fields) may be the same for different frequencies. Thus, example embodiments solve the matching issue compared to conventional approaches.

In MRI applications, the specific absorption rate (SAR) is defined as the rate at which RF power is absorbed by the human body. SAR is typically defined as energy per unit of mass of an object and may be measured in watts per kilogram. In conventional systems, the SAR is estimated by using power readings from the amplifier. However, at low flip angles (e.g. at a very small RF output) the amplifier efficiency in a conventional system is low, and as a result, the SAR estimation from the power readings may not be accurate. Therefore, in order to ensure an adequate safety margin in conventional systems, the transmitter is oversized. In some applications, the transmitter power rating may be significantly greater than the necessary RF power requirement, which is wasteful. For example, the transmitter power rating in a conventional system may be up to seven times of what is required. Conventional MRI systems thus sacrifice performance and have suboptimal operation, while increasing cost, energy consumption, and size. Embodiments described herein employ high efficiency class D amplifiers that provide sufficient RF power even at low flip angles to provide accurate power readings.

The dynamical power range of a traditional commercial MRI RF amplifier is approximately 30-40 dB. Thus, the baseband signal power needs to be approximately 30-40 dB higher than the side band noise power. Using only one class D amplifier and controlling the class D amplifier's output by turning it ON and OFF, results in an output equal to 1 or 0. This is effectively a 1 bit analog to digital converter (ADC). The dynamic range of an ADC is defined as Dynamic Range (DR)=6.02N+1.763 dB where N is the total number of bits. For this situation the bit number is 1. Thus the DR for this single digital current source is 6.02*1+1.763=7.783 dB. This is well below the 30-40 dB power dynamic range requirement.

To increase DR, example embodiments may employ dithering to increase dynamic range without increasing the total number of bits. Dithering, as employed herein, may be defined as adding random noise to an input signal before digitization. Dithering can add up to 8 dB or even 10 dB to the dynamic range. Therefore, a 1 bit DR range can improve to about 17 dB which is still much lower than the 30-40 dB range requirement. To further increase dynamic range embodiments described herein may create more bits for a digital current source.

FIG. 1 illustrates an example embodiment of a digital current source 100. Digital current source 100 includes a class D amplifier 111. Recall that a class D amplifier is an amplifier that is configured to operate as an electronic switch. Class D amplifier 111 is controlled by a digital input 112. When digital input 112 has a value of 1, class D amplifier 111 is controlled to connect to a positive voltage +V. When the digital input 112 has a value of zero, the class D amplifier 111 connects to ground. When digital input 112 has a value of −1, class D amplifier 111 is controlled to connect to a negative voltage −V. Embodiments described herein may employ a digital input 112 that has three values as described (e.g. 1, 0, −1) or two values (e.g. 1, 0, or 0, −1, or 1, −1). When two values (e.g. 1, 0) are employed, class D amplifier 111 is controlled to connect to a positive voltage V+ upon receiving a digital input 112 with a value of 1, or to connect to ground upon receiving a digital input 112 with a value of 0. In another embodiment, a digital input 112 value of 0 or a digital input 112 value of −1 controls class D amplifier 111 to connect to ground, while a digital input 112 value of +1 controls class D amplifier 111 to connect to positive voltage +V. In another embodiment, a digital input 112 value of 0 or a digital input 112 value of −1 controls class D amplifier 111 to connect to a negative voltage −V, while a digital input 112 value of +1 controls class D amplifier 111 to connect to positive voltage +V. Embodiments described herein thus facilitate varying amplitude, the voltage range, or bit range of class D amplifier 111, or class D amplifiers 211, 213, 215, or 217, by controlling class D amplifier 111, or class D amplifiers 211, 213, 215, or 217, to enter either one of three states (+V, ground, −V) or one of two states, for example (+V, ground), or (+V, −V). In other embodiments, other configurations of class D amplifier 111 and digital input 112 may be employed.

The output impedance of the class D amplifier 111 is low. Digital current source 100 further includes a transmission line 120. Transmission line 120 has a length. Transmission line 120 may, in one embodiment, be a co-axial cable. The length of transmission line 120 may be a quarter wavelength ($\lambda/4$) or odd integer number of $\lambda/4$. In this embodiment, class D amplifier 110 is connected by a quarter wavelength or odd integer number of quarter wavelength transmission line 120 to a load 130 which, in this example, is an MRI RF transmit/receive coil.

The intrinsic or characteristic impedance of the $\lambda/4$ transmission line 120 is represented as $Z_0$. The output impedance of the other side of transmission line 120 is defined as $Z0^2$/output impedance of class D amplifier 111. This output impedance at the other side of transmission line 120 is high because the output impedance of class D amplifier 111 is low. If the impedance of load 130 is low, the output current can be written as V/Z0 which is independent of the load 130. In this example, a low load impedance means a load impedance much smaller than $Z0^2$/output impedance of class D amplifier 111. For example, the load 130 here is an MRI RF transmit/receive coil. At the resonant frequency the inductive impedance and capacitive impedance cancel each other and only real impedance is left. The real impedance is normally several Ohms. If Z0 is 50 ohms and the output impedance of class D amplifier 111 is 10 Ohms, then $50^2/10$=250 which is much greater than several Ohms. While FIG. 1 illustrates one digital current source 100 for clarity, multiple digital current sources 100 may be configured in parallel and used to drive one load, for example, one MRI RF coil. One embodiment of multiple digital current sources configured in parallel and used to drive one load is shown in FIG. 2.

Figure 2:
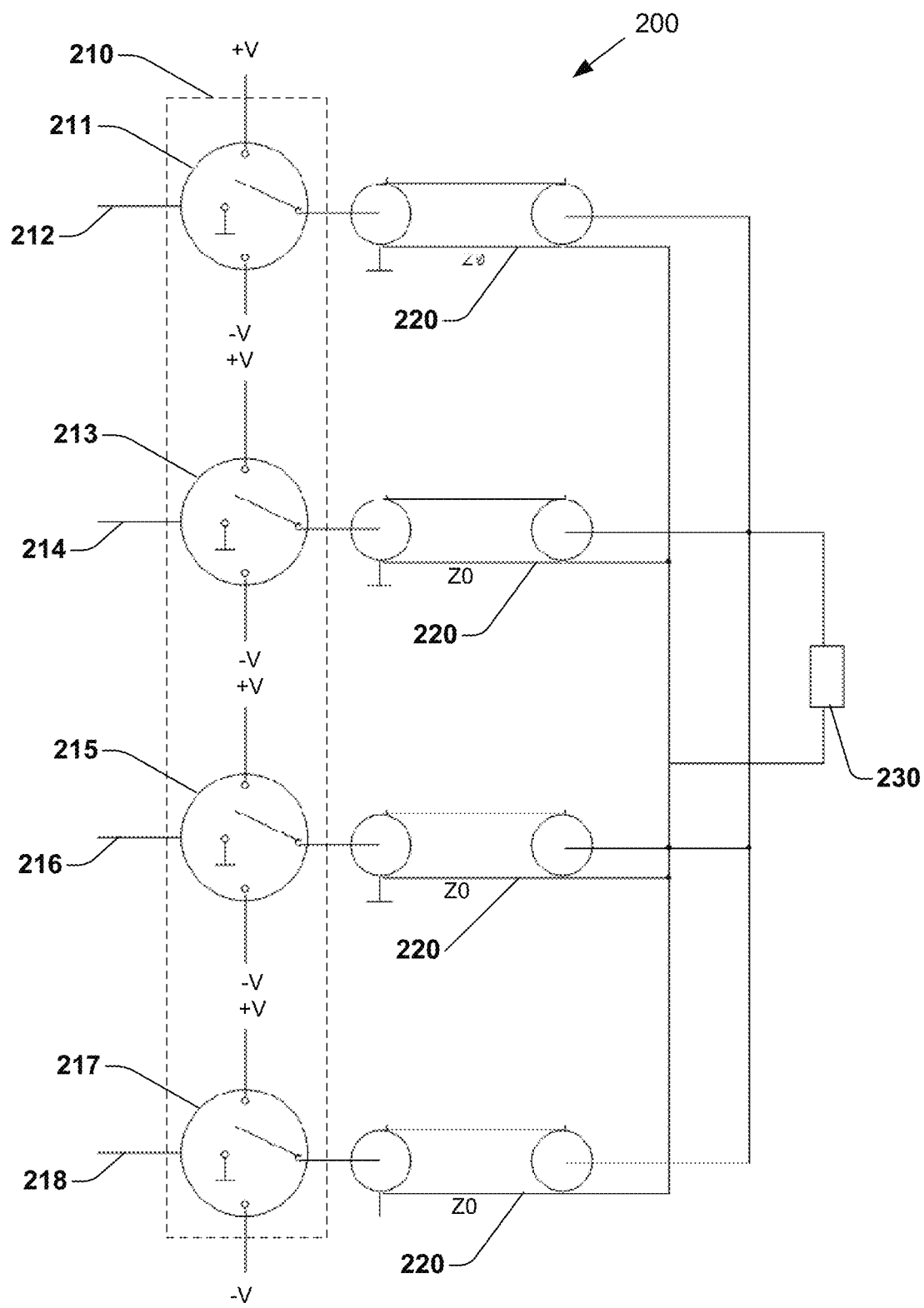
FIG. 2 illustrates an embodiment of a digital RF current source.

FIG. 2 illustrates an example embodiment of a digital RF current source 200. Digital RF current source 200 includes a plurality of class D amplifiers 210. In this embodiment, the plurality of class D amplifiers 210 includes four class D amplifiers 211, 213, 215, and 217. A member of the four class D amplifiers 211, 213, 215, and 217 is configured to receive an independent digital control 212, 214, 216, or 218. When an independent digital control 212, 214, 216, or 218 has a value of +1, the respective class D amplifier 211, 213, 215, or 217 is controlled to connect to a positive voltage +V. When independent digital control 212, 214, 216, or 218 has a value of zero, the respective class D amplifier connects to ground. When independent digital control 212, 214, 216, or 218 has a value of −1, the respective class D amplifier connects to a negative voltage −V. The output impedance of the class D amplifier 211, 213, 215, and 217 is low. Thus, in this example, digital current source 200 includes four class D amplifiers 211, 213, 215, and 217 that may receive one of four independent digital controls 212, 214, 216, or 218 respectively, where the one of four independent digital controls 212, 214, 216, or 218 respectively control the associated member of the plurality of class D amplifiers 210 to connect to a positive voltage +V, to ground, or to negative voltage −V. In another embodiment, a member of the plurality of class D amplifiers 210 is controlled to connect to a positive voltage +V upon receiving a digital input having a value of +1, or to ground upon receiving a digital input of 0 or −1.

The four class D amplifiers 211, 213, 215, and 217 are connected in parallel using transmission lines 220 to a load 230. A member of transmission lines 220 has a length. The length of member of transmission lines 220 may be a quarter wavelength or odd number multiple of quarter wavelength. In one embodiment, the load 230 is an MRI RF coil. The four class D amplifiers 211, 213, 215, and 217 may drive the load 230. While four class D amplifiers 211, 213, 215, and 217, four independent digital controls 212, 214, 216, or 218, and four transmission lines 220 are illustrated in FIG. 2, other, different numbers of class D amplifiers, and respective independent digital controls or transmission lines may be employed. For example, another embodiment may include five class D amplifiers, five independent digital controls, and five transmission lines. Still another embodiment may include eight class D amplifiers, eight independent digital controls, and eight transmission lines, or another, different number of class D amplifiers, independent digital controls, and transmission lines.

The output current of a member of the four class D amplifiers 211, 213, 215, and 217 may cancel and add to other members of the four class D amplifiers' 211, 213, 215, and 217 current. For example, if the value of one independent digital control (e.g. digital control 212) is 1, the current output of the respective associated member of the four class D amplifiers (e.g. 211) is positive V/Z0. If another, different digital control (e.g. digital control 214) has a value of −1, then the current output of the associated member of the four class D amplifiers (e.g. 213) is negative V/Z0. Then the sum of the two current outputs is zero. Since a member of the plurality digital controls 211, 213, 215, or 217 is independent of another member of the plurality of digital controls, then we can have 4(1+1+1+1), 3(1+1+1+0), 2, 1, 0, −1, −2, −3, −4 current steps through the load, which is approximately three bits. Then we have 6.02*3+1.763+10 (dithering)=29.8 dB. This is almost the required 30-40 dB. An embodiment with 8 switches or class D amplifiers in parallel, will have 17 steps which is approximately four bits. This results in a 36 dB DR, which is well within the required dynamics range of 30 dB-40 dB.

In one embodiment, independent digital controls 211, 213, 215, or 217 may include a master clock signal. The master clock signal may synchronize the phase among the four class D amplifiers 212, 214, 216, and 218 respectively.

In one embodiment, independent digital controls 211, 213, 215, or 217 may be generated using dithering. In another embodiment, independent digital controls 211, 213, 215, or 217 may be generated using noise shaping. Generating the independent digital controls 211, 213, 215, or 217 using dithering or noise shaping improves the dynamic range. Class D amplifiers, transmission lines, and LC resonant circuits have their own resonant spectrum. The LC resonant frequency range is just a very small spectrum in the whole spectrum. Therefore, in one embodiment, noise shaping techniques can be further used to suppress noise at other spectrum frequencies to further increase dynamic range and decrease side band resonance.

Figure 3:
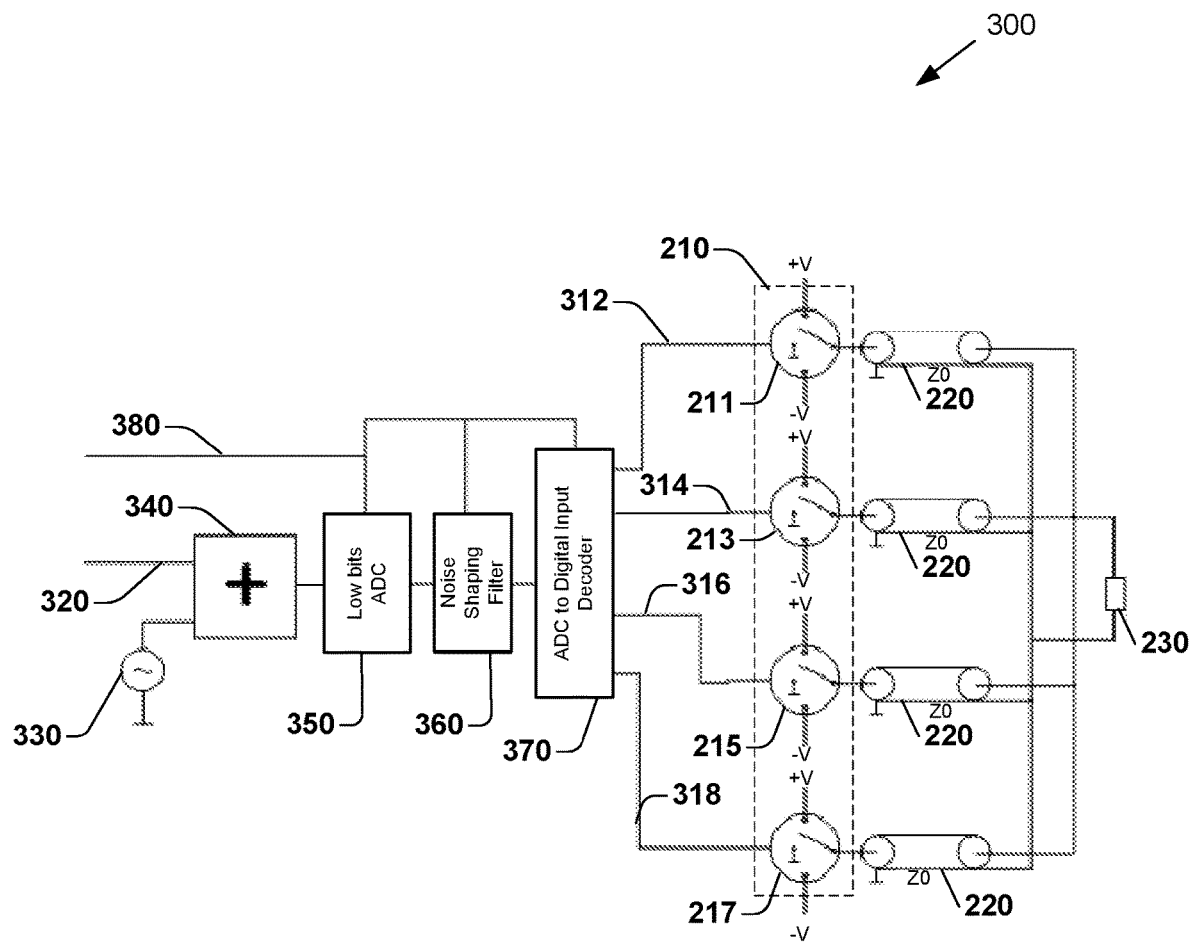
FIG. 3 illustrates an embodiment of a digital RF current source.

FIG. 3 illustrates an example embodiment of a digital RF current source 300. Digital RF current source 300 is similar to digital RF current source 200 but includes additional elements and details. In one embodiment, digital RF current source 300 includes a noise shaping component 360. The digital RF current source 300 also includes noise source 330. In this embodiment, digital current source 300 is configured to employ dithering by using noise applied by noise source 330. In one embodiment, digital RF current source 300 employs dithering, and the noise shaping component 360, without requiring the use of memory or pre-calculated bit patterns. In this embodiment, an MRI system (not illustrated) employing digital RF current source 300 provides a master clock 380 and an input RF signal 320. Noise is added by noise source 330 into the input RF signal 320 at dithering component 340 for dithering. The signal is then sampled by a low bit high speed ADC 350. For example, in the embodiment illustrated in FIG. 3, four class D amplifiers 211, 213, 215, and 217 are illustrated which results in a 4 bit ADC 350 being employed. In this embodiment, the ADC 350 can sample from 0 to 15 with a step of one. However, in this embodiment, not all 16 steps are used. Instead, in this embodiment, only 9 steps are used because the four class D amplifiers 211, 213, 215, and 217 can only support 4, 3, . . . , −3, −4. Thus, the range and reference of ADC 350 is adjusted such that 0 is at the negative maximum amplitude of input RF signal 320, and 8 is at the positive maximum amplitude of input RF signal 320. After ADC 350, the signal passes to the noise shaping filter 360 which is applied to minimize noise at undesired frequency ranges due to resonance considerations. Then, an ADC to digital input decoder 370 changes the filtered ADC digital output to a digital input signal which is delivered to the four class D amplifiers 211, 213, 215, and 217. For example, if the filtered ADC output is 8, the ADC to digital input decoder 370 will output 1,1,1,1 to control class D amplifiers 211, 213, 215, and 217. If the filtered ADC output is 4, then the ADC to digital input decoder 370 will output 0,0,0,0. Other outputs based on other, different filtered ADC outputs may be generated.

Embodiments described herein, including digital RF current source 300, provide a digital RF current source for an MRI system that improves on conventional approaches. Embodiments described herein facilitate requiring an input that includes only a master clock and a small RF signal input. Existing MRI systems in use in hospitals, laboratories, universities, or other institutions, may already provide a master clock and small RF signal input, and may thus readily accept embodiments described herein with minimal or no costly and time consuming modifications.

In example embodiments illustrated and described herein, +V and −V represent a DC power supply to power the class D amplifier 110, or class D amplifiers 211, 213, 215, and 217. Example DC power supplies indicated by +V and −V may range from +/−100V. Example DC power supplies indicated by +V and −V may include current of up to 2 A. In other embodiments, other voltage ranges or currents may be employed.

Figure 4:
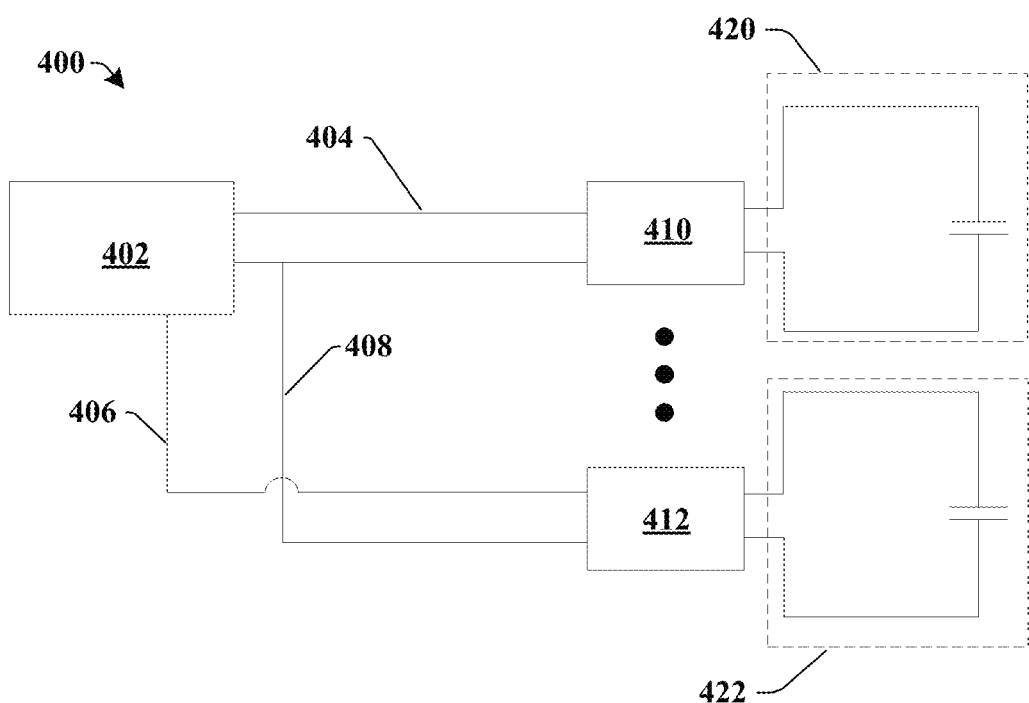
FIG. 4 illustrates an embodiment of an MRI system.

Embodiments of digital current sources described herein, including digital RF current source 300 and digital RF current source 200, may be employed by an MRI system, including MRI system 400 illustrated in FIG. 4. FIG. 4 illustrates an embodiment of an MRI system 400. In this embodiment, MRI system 400 includes system control console 402 operably connected to a first digital RF current source 410 and to an $n^{th}$ digital RF current source 412. Digital RF current source 410 or 412 may be configured to operate as an amplifier to drive RF Tx coils 420 and 422 respectively. In one embodiment, digital RF current source 410 or nth digital RF current source 412 may include, for example, digital RF current source 200 or digital current source 300. The number n of digital RF current sources may vary depending on system or design characteristics, where n is an integer. For example, an MRI system 400 may include just one digital RF current source 410, or two digital RF current sources 410 and 412. In another embodiment, MRI system 400 may include three or more digital RF current sources.

The system control console 402 sends a first multi-digit bit pattern 404 to the first digital RF current source 410, and sends an $n^{th}$ multi-digit bit pattern 406 to the $n^{th}$ digital RF current source 412. The multi-digit bit pattern 404 or $n^{th}$ multi-digit bit pattern 406 may control the output magnitude and phase of digital RF current sources 410 and 412, respectively. In one embodiment, to synchronize the phase among the RF current sources 410 and 412, the system control console 402 sends a master RF current source clock signal 408 to the one or more of digital RF current sources 410 and 412.

In some embodiments, a first cable that connects the system control console 402 with the first digital RF current source 410 has a first length. A second cable that connects system control console 402 with the $n^{th}$ digital RF current source 412 may have a second length that is the same as the first length, or within a threshold level of similarity to the first length. For example, the first length and the second length may be within 1 mm of the same length. The threshold level may be based on, for example, proximity of the system control console 402 with the first digital RF current source 410 or the $n^{th}$ digital RF current source 412, an operating frequency, impedance matching, or other design characteristics. The cable length between the system control console 402 and the RF current sources 410 and 412 may be controlled to ensure that the phase delays of the clock are within the desired parameters for synchronization. The first digital RF current source 410 is electrically coupled to a first RF Tx coil 420. The $n^{th}$ digital current source 412 is electrically coupled to an $n^{th}$ RF Tx coil 422.

The digital RF current sources 410 and 412 maintain high efficiency under modulation, and thus may provide adequate average RF power even at low flip angles. For example, in fast low angle shot (FLASH) MRI sequences, example embodiments provide accurate SAR readings without the need for significant, safety-critical transmitter oversizing. Embodiments described herein thus improve on conventional approaches.

The dependence of the RF coil current on the transmitting coil is due to the RF transmitter output impedance and load matching. A mismatch may cause a break of the system control over the magnetic field and flip angle. Digital RF current sources, including digital RF current sources 200 and 300, as employed by example embodiments, including MRI systems 400 and 500, correct these problems. Secondly, conventional MRI scanners may reach the SAR limit with a reduced RF power level and a correspondingly high duty cycle in FLASH MRI sequences. The efficiency of conventional linear analog and switch mode RF amplifiers severely degrades under modulation. Commercial conventional MRI systems may then include an oversized transmitter that in some instances is as much as seven times, or more, beyond the SAR power limit. The oversized transmitter then may have associated costs and safety risks. Example embodiments that employ digital RF current sources, including direct digital single sideband RF current sources, eliminate the need for costly, oversized transmitters, and thereby improve on conventional approaches.

Direct digital single sideband RF current sources, as employed by embodiments described herein, have high efficiency at any modulation and duty cycle and eliminate the need for oversizing. By inverting the very low output Thevenin impedance R of switch mode alternating current (AC) generators, AC voltage sources may effectively have a load-independent high efficiency, which may be greater than 80%, or even close to 1. The impedance transformer may be a quarter wave length or odd number of quarter wavelength transmission line segment or a lumped element version of a quarter wavelength transmission line, such as Pi or T circuit. The RF switcher output voltage, the RF coil current, and the transmit magnetic field B may all be controlled with digital computers. RF power may then be generated in amplitude and phase directly at the baseband without any analog small signal modulators, amplifiers, circulators, dummy loads, current sensors or feedback control. Baseband RF synthesis and the wideband properties of the inverter circuit may place the idle amplitude modulation (AM) sideband far from the base band close to an impedance pole. This also avoids harmonics within the baseband and at circuit series resonances. Digital RF current source 410 and RF Tx coil 420 may be in one embodiment direct digital signal sideband RF current sources. By employing direct digital RF current sources, embodiments described herein are less complex, and offer improved performance over conventional approaches.

The embodiment described with respect to FIG. 4 gives the full flexibility of control from the system control console 402. The bit patterns being transmitted are pre-calculated using dithering and noise shaping techniques in which the dynamic range is better than 30 dB. However, the bit pattern transmission speed requirement between the system control console 402 and one or more digital RF current sources 410 or 412 could be very high, e.g., if 160 MHz sampling rate is used at 1.5 T (63.6 MHz) and each digital current source has 8 independent class D switches, then each digital current source will need 160×8=1.28 Gbit/sec. If an MRI system has N digital current sources, then minimum digital transmission speed is 1.28 Gbit/sec*N. This transmission speed may be expensive with respect to bandwidth, may not be practical in a clinical situation, and thus may be sub-optimal.

Figure 5:
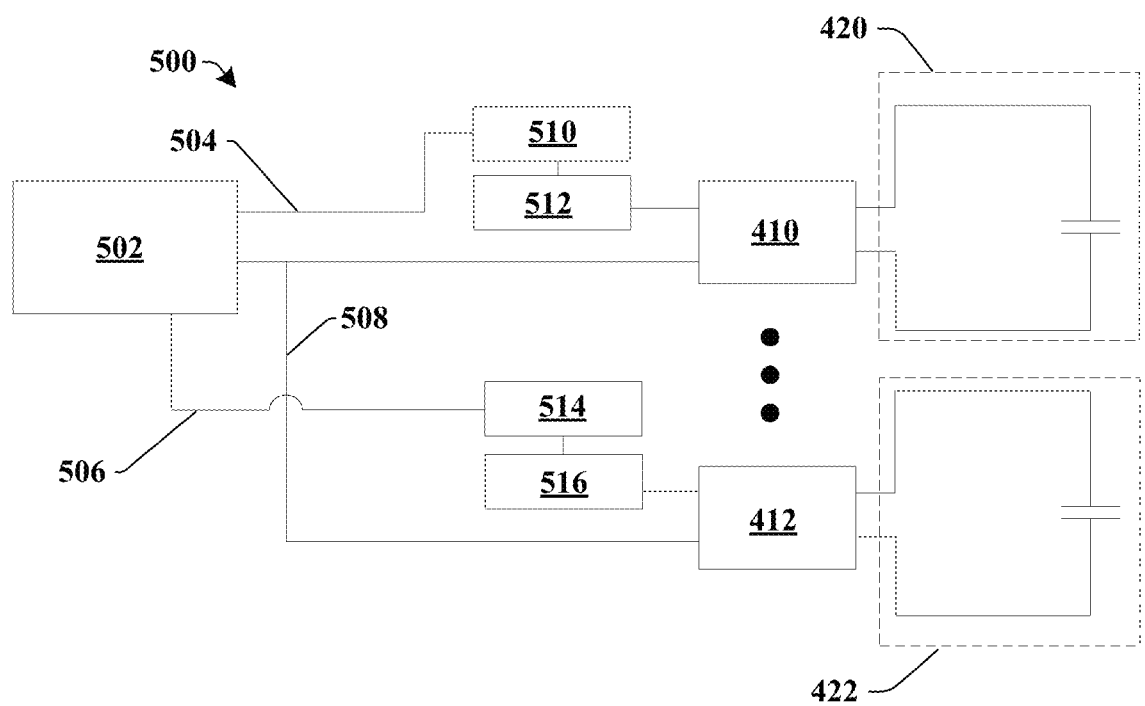
FIG. 5 illustrates an embodiment of an MRI system.

FIG. 5 illustrates another embodiment of an MRI system 500 that is similar to MRI system 400, but includes additional elements and details. MRI system 500 stores the pre-calculated digit bit patterns using dithering and noise shaping techniques near the digital RF current sources 410 or 412. In this embodiment, the system control console 502 does not need to send a high speed bit pattern. Instead the system control console 502 may send either a first small level RF signal or a first digital control signal 504 to a first console signal-to-bit pattern translator 510. The first small level RF signal or first digital control signal 504 may be an analog sin c function with a defined amplitude and phase. The first console signal-to-bit pattern translator 510 converts the first small level RF signal or first digital control signal 504 to a control signal and sends the control signal to a first memory 512. First memory 512 may be, for example, RAM, flash memory, or other type of electronic memory suitable for storing a bit pattern. The first memory 512 then selects the correct bit pattern based on the control signal sent from signal-to-bit pattern translator 510 and sends the selected correct bit pattern to the first digital RF current source 410. In one embodiment, signal to bit pattern translator 510 or first memory 512 is controlled by a processor or FPGA (not illustrated) to select the control bit pattern. Since the first memory 510 is physically very close to the first digital RF current source 410, there is no high speed bit pattern transmission required from the system control console 502.

The proximity of the first memory unit 512 with the first digital RF current source 410 may be within a threshold distance. For example, in one embodiment, the first memory unit 512 may be located within two cm of the first digital RF current source 410. In another embodiment, the threshold distance may be another, different distance (e.g. 1 cm, 3 cm). In another embodiment, the system control console 502 may also use a digital control signal coupled to the first memory unit 512 to select the bit pattern to use to drive the first digital RF current source 410. The first digital RF current source 410 then may comprise an amplifier (e.g. digital RF current source 200, digital RF current source 300) and drive current into the first RF Tx coil 420. To synchronize the phase among different RF current source amplifiers the system control console 502 sends a master RF current source clock signal 508 to one or more digital RF current sources 410 and 412.

The architecture described above with regard to elements 502, 504, 510, 512, and 410 may be repeated n number of times in a similar manner as described in regards to FIG. 4. The number n of digital RF current sources 412 may vary depending on system or design characteristics. For example, the system control console 502 may send either an $n^{th}$ small level RF signal or an $n^{th}$ digital control signal 506 to an $n^{th}$ console signal-to-bit pattern translator 514. The $n^{th}$ small level RF signal or $n^{th}$ digital control signal 506 may be an analog sin c function with a defined amplitude and phase. The $n^{th}$ console signal-to-bit pattern translator 514 converts $n^{th}$ digital control signal 506 to a control signal and sends the control signal to an $n^{th}$ memory 516. The $n^{th}$ memory 516 then selects the correct bit pattern based on the signal from signal-to-bit pattern translator 514 and sends the bit pattern to the $n^{th}$ digital RF current source 412. Since the $n^{th}$ memory 512 is physically very close to the $n^{th}$ digital RF current source 412, there is no high speed bit pattern transmission required from the system control console 502. The proximity of the first memory unit 512 may be within a threshold distance of the $n^{th}$ digital RF current source 412. In another embodiment, the system control console 502 may also use a digital control signal coupled to the $n^{th}$ memory unit 516 to select the bit pattern to use to drive the $n^{th}$ digital RF current source 412. The $n^{th}$ digital RF current source 412 then may comprise an amplifier (e.g. digital RF current source 200, digital RF current source 300) and drive current into the nth RF Tx coil 422. Embodiments described herein control the cable length between the system control console 502 and the RF current sources 410 and 412 so that the phase delays of the master RF current source clock signal 508 are within the desired parameters for synchronization. In one embodiment, this is achieved by making the cables connecting the system control 502 and RF current sources to be synchronized substantially equivalent in length, or within a certain length of each other.

Figure 6:
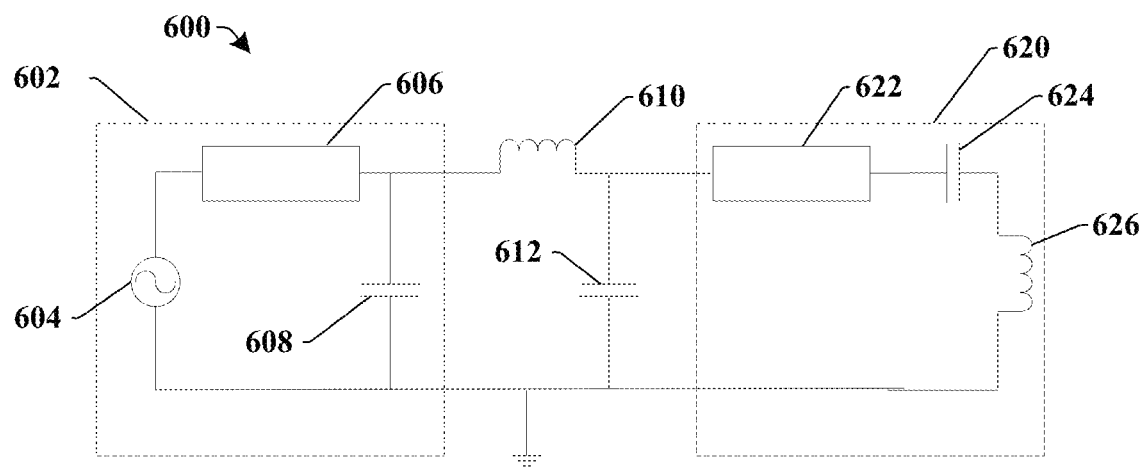
FIG. 6 illustrates an embodiment of a digital RF current source.

FIG. 6 illustrates an embodiment of a digital RF current source 600 suitable for use by embodiments described herein. In one embodiment, digital RF current source 600 may include a pulser 602 and an LC RF MRI coil 620. The pulser 602 may include an alternating voltage source 604 electronically coupled to an inductor 610, which is then electronically coupled to capacitor 612, where 606 represents the internal resistance of voltage source 604, and 608 represents the parasitic capacitance of voltage source 604. In this embodiment, the value of the internal resistance of voltage source 604 is small, which in this example is less than 10 Ohm. Parasitic capacitance 608, inductor 610, and capacitor 612 create a lumped element "Pi" quarter wavelength transmission line. Component 620 may include a capacitor 624 and inductor 626. Inductor 626 and capacitor 624 are configured to operate together as LC RF MRI coil 620. where 622 represents the coil loss which includes inductor resistive loss and the loading resistance from an EM field coupling between LC RF MRI coil 620 and a scanned subject (e.g. patient). The digital current source 600 is an exemplary embodiment of circuitry that may be used as digital RF current sources 410 or 412 and coils 420 or 422. As one with ordinary skill in the art would appreciate, other digital RF current sources may be used.

In one embodiment of digital current source 600, pulser 602 is an ultrasound pulser integrated circuit (IC). Ultrasound pulser ICs have a low cost, are readily available, and have RF voltage sources with high clock rate synchronous digital three level control. The following provides example values for the components of the system suitable for use by example embodiments described herein. For instance, Maxim MAX14809 pulser ICs may feature eight +/−100V, +/−2.5 A output channels in a 10×10 mm package, or other pulser ICs, may be used. A 63.6 MHz band center frequency and 80 pF channel output capacitance may have an individual impedance (Z) of 32 Ohm lumped Pi low-pass lambda/4 transformers. Dual +/−30V supply voltage may result, for example, in 40V AC, or 1.25 A coil current, and a 50 Ohm maximum load per current source. The inductor may have inductance (L) of 320 nH. RF Tx coil 420 or 422 may have a 7 Ohm max series impedance including off-resonance reactance, and thus may accept up to 8 parallel current sources, for example, or a single full IC. A 10 amp combined output current (320 watt peak RF power) may then be available over more than a +/−1 MHz bandwidth. A series resonant RF coil may be augmented with low inductance resistors and may be used to cover a range of Q~90 to 15, where Q represents the quality factor. In such a setup, the magnetic field amplitude may vary by approximately 3% under such transmitting coil and with ±1 MHz frequency variations. The pulser load circuit may have series resonances within a threshold frequency of 57 MHz and 71 MHz and a parallel resonance at 90 MHz. Utilizing a bit clock at, for example, 180 MHz avoids aliasing into the base band or series resonances up to, for example, the 23rd harmonic, and minimizes power at the amplitude modulated (AM) mirror sideband, at for example, 180−63.6=116.4 MHz. Three-level modulation allows for sparse switching with correspondingly low power dissipation and high efficiency at any instantaneous power level. A 10 W average output power keeps the 4 W IC thermal limit independent of instantaneous burst amplitudes. While parameters described herein are described as having particular assigned values, other values may be employed.

Figure 7:
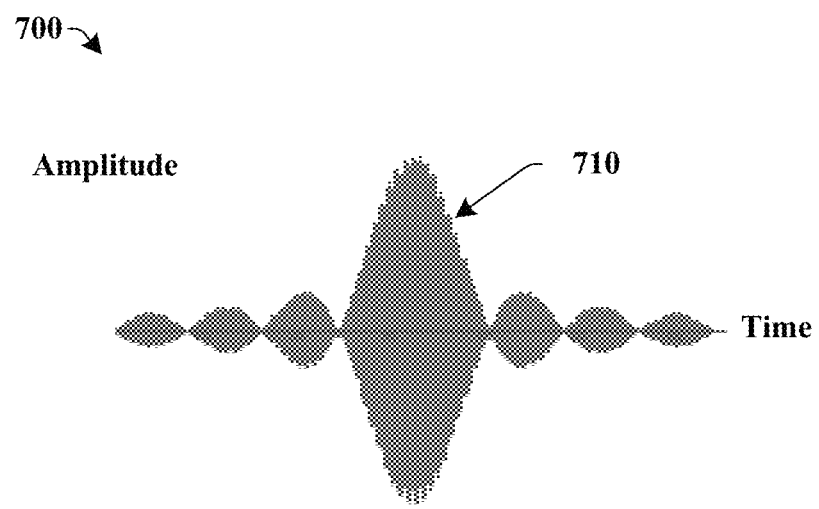
FIG. 7 illustrates an example of a sin c function.

FIG. 7 is a graph 700 of an example cardinal sine (SINC) function 710 that illustrates RF current flowing in a RF Tx coil (e.g. 420, 422, load 230) while in transmitting mode. In one embodiment, the sin c function 710 may be sin c(w*t) =sin(w*t)/(Pi*w*t), where w is the angular frequency, and t is time. The sin c function 710 may have a carrier frequency at 63.6 MHz and bandwidth of 100 KHz, for example.

Figure 8:
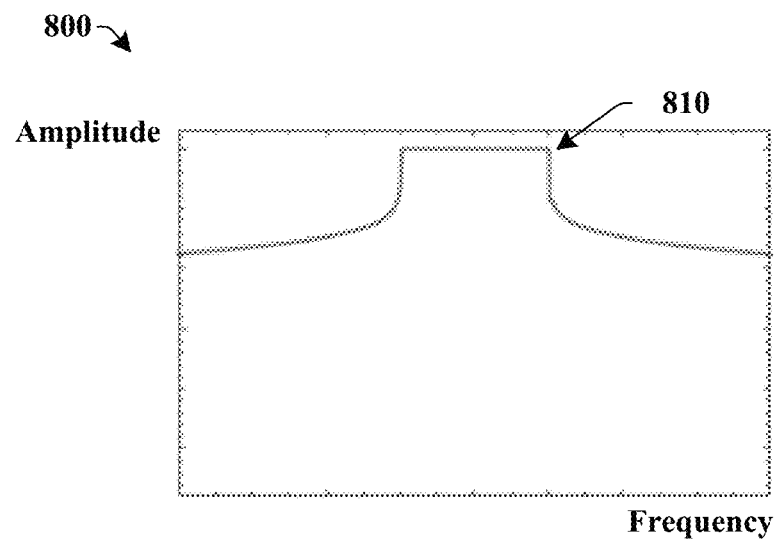
FIG. 8 is a graph of an example signal in the frequency domain.

FIG. 8 is a graph 800 of an example signal in the frequency domain. A Fourier Transform 810 of the sin c function illustrated in FIG. 7 is illustrated in the frequency domain, and may be, for example, a box car function. The vertical axis indicates an amplitude in a log scale and the horizontal axis indicates a frequency in kHz.

Figure 9:
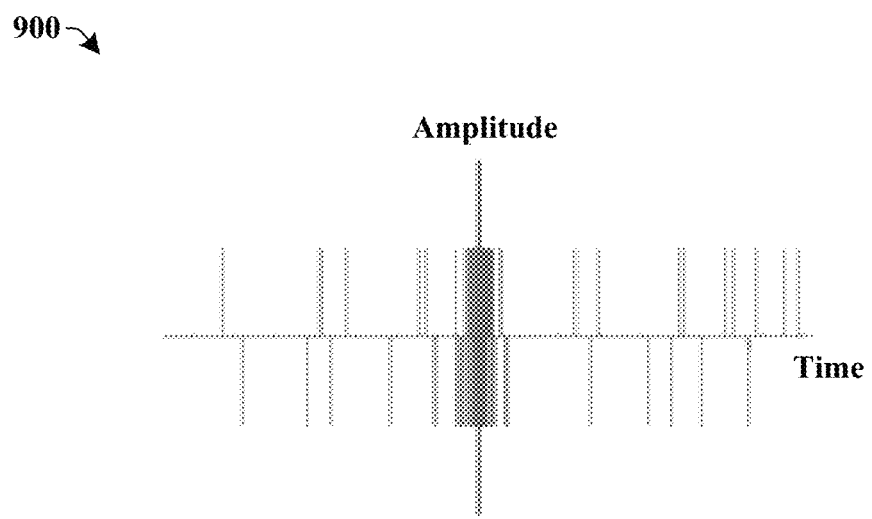
FIG. 9 illustrates an example of a digital bit pattern.
Figure 11:
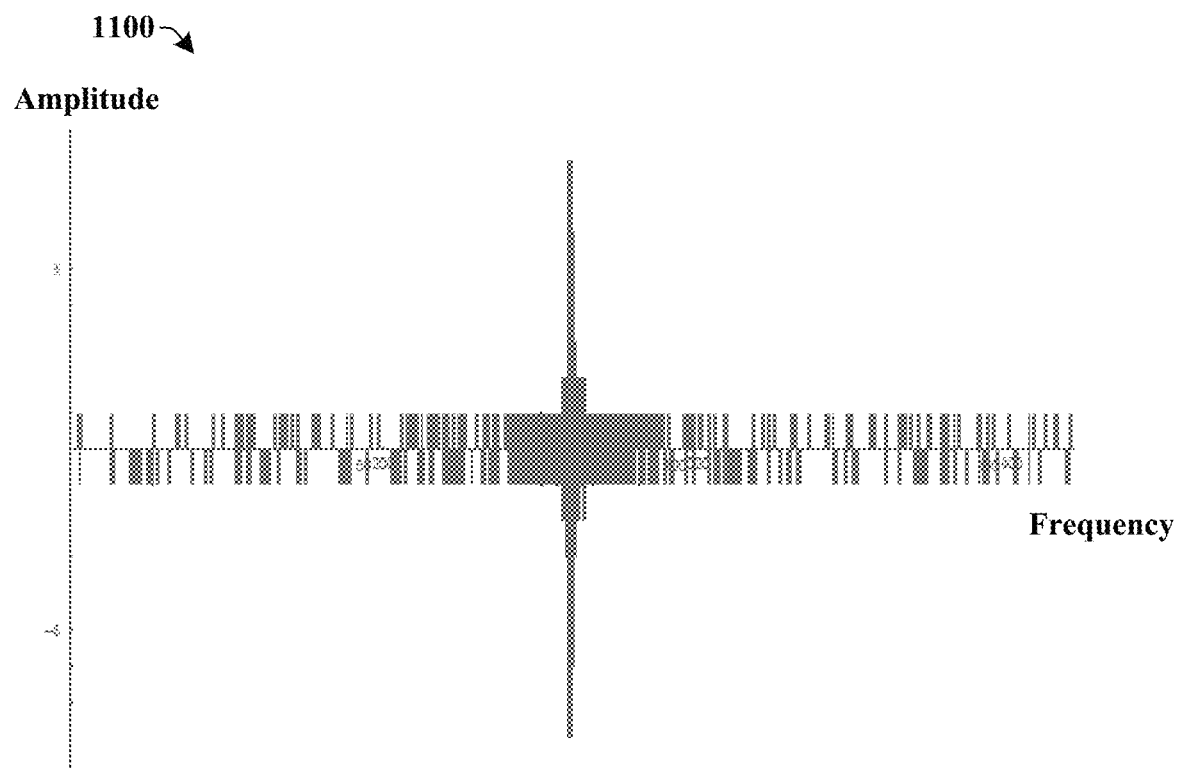
FIG. 11 illustrates an example digital bit pattern.

FIG. 11 illustrates a sampled sin c function 1100 at 63.6 MHz with a 200 KHz "boxcar" shape bandwidth with dithering. In the example illustrated in FIG. 11, the bit pattern has 5 states (2, 1, 0, −1, −2), a carrier frequency at 63.6 MHz, and bandwidth 100 kHz. In other embodiments, other discrete bit patterns may be employed. For example, FIG. 9 illustrates another example sampled sin c function 900. The master clock may be, for example, 160 MHz. The example digital bit pattern in the time domain 900 may, in some embodiments, be employed as multi-digit bit pattern 404 or 406 that is transmitted from the system control console 402 to one or more RF current sources 410 or 412.

Figure 10:
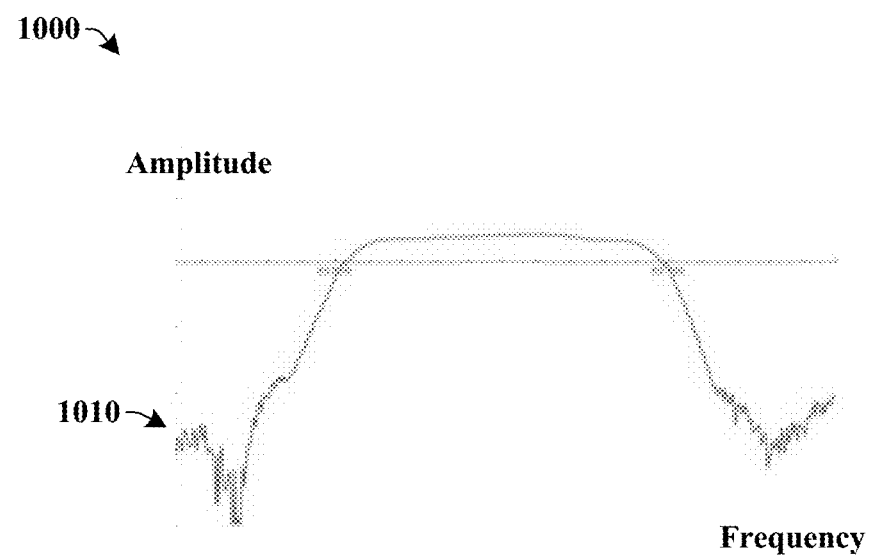
FIG. 10 is a graph of an example signal in the frequency domain.
Figure 12:
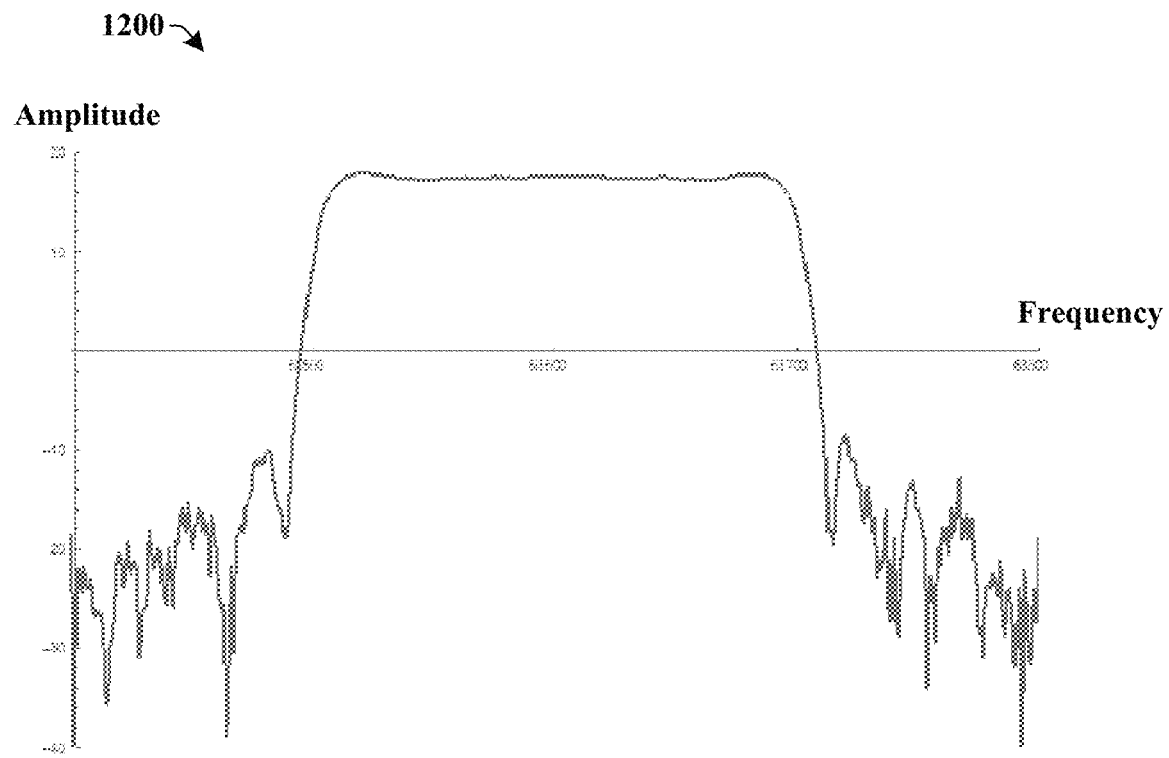
FIG. 12 is a graph of an example signal in the frequency domain.

FIG. 12 illustrates a graph 1200 of the Fourier transform of the sampled signal illustrated in FIG. 11. The Fourier transform illustrated in FIG. 12 is centered at 63.6 MHz. As indicated by the Fourier transform illustrated in FIG. 12, the DR is better than −30 dB. In other embodiments, other Fourier transforms of sampled signals may be generated. For example, FIG. 10 is a graph 1000 of another an example signal in the frequency domain. A Fourier Transform 1010 of the digital bit pattern in the time domain signal 900 is displayed in graph 1000.

Digital RF switch mode current sources employed in example embodiments eliminate image artifacts caused by magnetic field amplitude errors, reduce time consuming transmitter calibration and adjustment, and prevent costly and safety critical RF transmitter oversizing. For example, in one embodiment, 320 W current source modules may be used and occupy less than a threshold area (e.g. 9 cm$^2$) of printed circuit board (PCB) space. 40 kW peak power for a whole body resonator may amount to 512 channels or 64 ICs, which may be integrated inside or close to, for example, an RF birdcage. Embodiments described herein thus provide concrete, measurable improvements over conventional approaches, which employ oversized current sources. Reducing the size of components, including current sources, used in MRI systems is desirable, particularly in the context of the small physical spaces enclosed by MRI magnets.

Circuits, apparatus, elements, MRI RF coils, arrays, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Circuit", as used herein, includes but is not limited to hardware, firmware, or combinations of each to perform a function(s) or an action(s), or to cause a function or action from another circuit, logic, method, or system. Circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, A&B, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Examples herein can include subject matter such as an apparatus, a digital RF current source, a system, a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for MRI according to embodiments and examples described.

Example 1 is a digital radio frequency (RF) current source 200 for a magnetic resonance imaging (MRI) system, the digital current source comprising: a plurality of class D amplifiers 210, where a member 211-217 of the plurality of class D amplifiers 210 has a first terminal and a second terminal, where the member 211-217 of the plurality of class D amplifiers 220 is configured to operate as a two-way switch, and where the member 211-217 of the plurality of class D amplifiers 220 is configured to receive a digital input signal 212-218 at the first terminal, where the digital input signal is a dithered input signal or a noise-shaped input signal; a plurality of transmission lines 220, where a member of the plurality of transmission lines 220 has a length, and where the member of the plurality of transmission lines 220 is electrically connected to the member of the plurality of class D amplifiers 211-217 at the second terminal; and an MRI radio frequency (RF) coil 230 configured to transmit or receive an RF signal; where the plurality of class D amplifiers 210 is electrically coupled in parallel to the MRI RF coil 230 with the plurality of transmission lines 220.

Example 2 comprises the subject matter of any variation of any of example(s) 1, where a first member of the plurality of class D amplifiers 210 is configured to be controlled independently of a second, different member of the plurality of class D amplifiers 210.

Example 3 comprises the subject matter of any variation of any of example(s) 2, where a member of the plurality of class D amplifiers 210, upon receiving a digital input having a first value, is controlled to enter a first position.

Example 4 comprises the subject matter of any variation of any of example(s) 3, where the member of the plurality of class D amplifiers 210, upon being controlled to enter the first position, receives a positive DC voltage.

Example 5 comprises the subject matter of any variation of any of example(s) 4, where the member of the plurality of class D amplifiers 210, upon receiving a digital input having a second, different value, is controlled to enter a second, different position, and where the member of the plurality of class D amplifiers 210, upon being controlled to enter the second, different position, is connected to ground.

Example 6 comprises the subject matter of any variation of any of example(s) 5, where the member of the plurality of class D amplifiers 210, upon receiving a digital input having a third, different value, is controlled to enter a third, different position, and where the member of the plurality of class D amplifiers 210, upon being controlled to enter the third, different position, receives a negative DC voltage.

Example 7 comprises the subject matter of any variation of any of example(s) 6, where the length of a member of the plurality of transmission lines 220 is one quarter wavelength ($\lambda/4$) of the RF signal or an odd integer multiple of $\lambda/4$ of the RF signal.

Example 8 comprises the subject matter of any variation of any of example(s) 7, where the length of a first member of the plurality of transmission lines 220 is within a threshold of the length of a second member of the plurality of transmission lines 220, and where a phase delay between the plurality of class D amplifiers 210 is a function of the length.

Example 9 comprises the subject matter of any variation of any of example(s) 7, where the member of the plurality of transmission lines 220 is a co-axial cable.

Example 10 comprises the subject matter of any variation of any of example(s) 4, where the member of the plurality of class D amplifiers 210, upon receiving a digital input having a second, different value, or a third different value, is controlled to enter a second, different position, where the member of the plurality of class D amplifiers 210, upon being controlled to enter the second, different position, is connected to ground.

Example 11 comprises a digital radio frequency (RF) current source 300 for a magnetic resonance imaging (MRI) system, the digital current source comprising: a noise source 330; a dithering component 340 electrically coupled to the noise source 330, where the dithering component 340 generates a dithered RF input signal by combining noise received from noise source 330 with an RF input signal 320; an analog-to-digital converter (ADC) 350 configured to receive the dithered RF input signal, where the ADC 350 has a range and a reference, and where the ADC 350 generates a sampled signal by sampling the dithered RF input signal; a noise shaping filter 360 electrically connected to the ADC 350, where the noise shaping filter 360 generates a noise shaped signal based, at least in part, on the sampled signal; an ADC to digital input decoder 370 electrically connected to the noise shaping component 360, where the ADC to digital input decoder 370 converts the noise shaped signal to a digital input signal; a plurality of class D amplifiers 210 electrically connected in parallel to the ADC to digital input decoder 370, where a member 211-217 of the plurality of class D amplifiers 210 has a first terminal and a second terminal, where the member 211-217 of the plurality of class D amplifiers 220 is configured to operate as a switch, where the member of the plurality of class D amplifiers is configured to receive the digital input signal 312-318 at the first terminal, and where a first member of the plurality of class D amplifiers 210 is configured to be controlled independently of a second, different member of the plurality of class D amplifiers 210; a plurality of transmission lines 220, where a member of the plurality of transmission lines 220 has a length, and where the member of the plurality of transmission lines 220 is electrically connected to the member 211-217 of the plurality of class D amplifiers 210 at the second terminal; and an MRI radio frequency (RF) coil 230 configured to transmit or receive an RF signal; where the plurality of class D amplifiers 210 is electrically coupled in parallel to the MRI RF coil 230 with the plurality of transmission lines 220.

Example 12 comprises the subject matter of any variation of any of example(s) 11, where ADC 350 adjusts the range and reference based, at least in part, on the negative maximum amplitude of the dithered RF input signal or the positive maximum amplitude of the dithered RF input signal.

Example 13 comprises the subject matter of any variation of any of example(s) 11, where a member of the plurality of class D amplifiers 210, upon receiving a digital input having a first value, is controlled to enter a first position.

Example 14 comprises the subject matter of any variation of any of example(s) 11, where the member of the plurality of class D amplifiers 210, upon being controlled to enter the first position, receives a positive DC voltage.

Example 15 comprises the subject matter of any variation of any of example(s) 11, where the member of the plurality of class D amplifiers 210, upon receiving a digital input having a second, different value, is controlled to enter a second, different position, and where the member of the plurality of class D amplifiers 210, upon being controlled to enter the second, different position, is connected to ground.

Example 16 comprises the subject matter of any variation of any of example(s) 15, where the member of the plurality of class D amplifiers 210, upon receiving a digital input having a third, different value, is controlled to enter a third, different position, and where the member of the plurality of class D amplifiers 210, upon being controlled to enter the third, different position, receives a negative DC voltage.

Example 17 comprises the subject matter of any variation of any of example(s) 16, where the length of a member of the plurality of transmission lines 220 is one quarter wavelength ($\lambda/4$) of the RF signal or an odd integer number of $\lambda/4$ of the RF signal.

Example 18 comprises the subject matter of any variation of any of example(s) 17, where the length of a first member of the plurality of transmission lines 220 is within a threshold of the length of a second member of the plurality of transmission lines 220, and where a phase delay between the plurality of class D amplifiers 210 is a function of the length.

Example 19 comprises the subject matter of any variation of any of example(s) 18, where a member of the plurality of class D amplifiers comprises an ultrasound pulser integrated circuit configured to receive the digital input signal and to drive the MRI RF coil 230.

Example 20 comprises a radio frequency (RF) transmit system 400 for a digital RF current source, the system comprising: a magnetic resonance imaging (MRI) system control console 402 operably connected to a digital RF current source amplifier 410; where the digital RF current source amplifier 410 is operably connected to an RF transmission coil 420; where the MRI system control console 402 provides a digital control signal 404 to the digital RF current source amplifier 410; where the MRI system control console provides 402 a master RF current source clock signal 408 to the digital RF current source amplifier; and where the digital RF current source amplifier 410 provides an alternating current to the RF transmission coil.

Example 21 comprises the subject matter of any variation of any of example(s) 20, where the MRI system control console 402 is operably connected to a plurality digital RF current source amplifiers 410-412.

Example 22 comprises the subject matter of any variation of any of example(s) 21, where the MRI system control console provides a plurality of control signals 404-406 to the plurality of digital RF current source amplifiers 410-412;

and where the MRI system control provides a master RF clock 408 to the plurality of RF current source amplifiers 410-412.

Example 23 comprises the subject matter of any variation of any of example(s) 22, where the MRI system control console 402 and the plurality of digital RF current sources 410-412 are operably coupled by a plurality of connection cables, where a member of the plurality of connection cables has a length.

Example 24 comprises the subject matter of any variation of any of example(s) 23, where a first member of the plurality of connection cables has a first length that is within a threshold tolerance of a length of a second, different member of the plurality of connection cables, and where a phase delay between the plurality of digital RF current source amplifiers is a function of the length of the members of the plurality of connection cables.

Example 25 comprises a radio frequency (RF) transmit system 500 for a digital RF current source, the system comprising: a magnetic resonance imaging (MRI) system control 502 console operably connected to a console signal-to-bit pattern translator 510 and a digital RF current source amplifier 410; a memory component 512 operably connected to the console signal-to-bit pattern 510 translator, where the memory component 512 stores a set of digital bit patterns, where the memory component 512 is further operably connected to the digital RF current source amplifier 410; where the MRI system control console 502 provides a first control signal 504 and a DC voltage to the console signal-to-bit pattern translator 510; where the console signal-to-bit pattern translator 510 converts the first control signal 504 to a second control signal and provides the second control signal to the memory component 512; where the memory component 512 selects a bit pattern from the set of digital bit patterns based on the second control signal; where the memory component 512 provides the bit pattern to the digital RF current source amplifier 410; and where the MRI system control console provides a master RF current source clock signal 508 to the digital RF current source amplifier.

Example 26 comprises the subject matter of any variation of any of example(s) 25, further comprising: an RF transmission (Tx) coil 420 operably connected to the digital RF current source amplifier 410.

Example 27 comprises the subject matter of any variation of any of example(s) 26, where digital RF current source amplifier 410 is a class D amplifier.

Example 28 comprises the subject matter of any variation of any of example(s) 25, where the first control signal 504 is an analog signal.

Example 29 comprises the subject matter of any variation of any of example(s) 25, where the first control signal 504 is a digital signal.

Example 30 comprises the subject matter of any variation of any of example(s) 25, where the MRI system control console 502 is operably connected to a plurality of console signal-to-bit pattern translators 510, 514 and a plurality of digital RF current source amplifiers 410, 412.

Example 31 comprises the subject matter of any variation of any of example(s) 30, further comprising a plurality of memory components 512, 516 respectively operably connected to the plurality of console signal-to-bit pattern translators 510, 514, where a member of the plurality of memory components 512, 516 stores a set of digital bit patterns, where the member of the plurality of memory components 512, 516 is further respectively operably connected to the plurality of digital RF current source amplifiers 410-412.

Example 32 comprises the subject matter of any variation of any of example(s) 31, where the MRI system control console 502 and the plurality of digital RF current sources 410-412 are operably coupled by a plurality of connection cables.

Example 33 comprises the subject matter of any variation of any of example(s) 32, where the plurality of connection cables are within a threshold of the same length, and where a phase delay between the plurality of digital RF current source amplifiers 410-412 is a function of the length of the connection cables.

Example 34 comprises the subject matter of any variation of any of example(s) 33, where the master RF current source clock signal 508 synchronizes the phase among the plurality of digital RF current source amplifiers 410-412.

What is claimed is:

1. A digital radio frequency (RF) current source for a magnetic resonance imaging (MRI) system, the digital RF current source comprising:
   a plurality of class D amplifiers, where a member of the plurality of class D amplifiers has a first terminal and a second terminal, where the member of the plurality of class D amplifiers is configured to operate as a switch, and where the member of the plurality of class D amplifiers is configured to receive a digital input signal at the first terminal, where the digital input signal is a dithered input signal or a noise-shaped input signal;
   a plurality of transmission lines, where a member of the plurality of transmission lines has a length, and where the member of the plurality of transmission lines is electrically connected to the member of the plurality of class D amplifiers at the second terminal; and
   an MRI RF coil configured to transmit or receive an RF signal;
   where the plurality of class D amplifiers is electrically coupled in parallel to the MRI RF coil with the plurality of transmission lines.

2. The digital RF current source of claim 1, where a first member of the plurality of class D amplifiers is configured to be controlled independently of a second, different member of the plurality of class D amplifiers.

3. The digital RF current source of claim 2, where a member of the plurality of class D amplifiers, upon receiving a digital input having a first value, is controlled to enter a first position.

4. The digital RF current source of claim 3, where the member of the plurality of class D amplifiers, upon being controlled to enter the first position, receives a positive DC voltage.

5. The digital RF current source of claim 4, where the member of the plurality of class D amplifiers, upon receiving a digital input having a second, different value, is controlled to enter a second, different position, and where the member of the plurality of class D amplifiers, upon being controlled to enter the second, different position, is connected to ground.

6. The digital RF current source of claim 5, where the member of the plurality of class D amplifiers, upon receiving a digital input having a third, different value, is controlled to enter a third, different position, and where the member of the plurality of class D amplifiers, upon being controlled to enter the third, different position, receives a negative DC voltage.

7. The digital RF current source of claim 4, where the member of the plurality of class D amplifiers, upon receiving a digital input having a second, different value, or a third different value, is controlled to enter a second, different position, where the member of the plurality of class D amplifiers, upon being controlled to enter the second, different position, is connected to ground.

8. The digital RF current source of claim 1, where the length of a member of the plurality of transmission lines is one quarter wavelength ($\lambda/4$) of the RF signal or an odd integer multiple of $\lambda/4$ of the RF signal.

9. The digital RF current source of claim 8, where the length of a first member of the plurality of transmission lines is within a threshold of the length of a second member of the plurality of transmission lines, and where a phase delay between the plurality of class D amplifiers is a function of the length.

10. The digital RF current source of claim 8, where the member of the plurality of transmission lines is a co-axial cable.

11. A digital radio frequency (RF) current source for a magnetic resonance imaging (MRI) system, the digital RF current source comprising:
   a noise source;
   a dithering component electrically coupled to the noise source, where the dithering component generates a dithered RF input signal by combining noise received from the noise source with an RF input signal;
   an analog-to-digital converter (ADC) configured to receive the dithered RF input signal, where the ADC has a range and a reference, and where the ADC generates a sampled signal by sampling the dithered RF input signal;
   a noise shaping filter electrically connected to the ADC, where the noise shaping filter generates a noise shaped signal based, at least in part, on the sampled signal;
   an ADC to digital input decoder electrically connected to the noise shaping filter, where the ADC to digital input decoder converts the noise shaped signal to a digital input signal;
   a plurality of class D amplifiers electrically connected in parallel to the ADC to digital input decoder, where a member of the plurality of class D amplifiers has a first terminal and a second terminal, where the member of the plurality of class D amplifiers is configured to operate as a switch, where the member of the plurality of class D amplifiers is configured to receive the digital input signal at the first terminal, and where a first member of the plurality of class D amplifiers is configured to be controlled independently of a second, different member of the plurality of class D amplifiers;
   a plurality of transmission lines, where a member of the plurality of transmission lines has a length, and where the member of the plurality of transmission lines is electrically connected to the member of the plurality of class D amplifiers at the second terminal; and
   an MRI RF coil configured to transmit or receive an RF signal;
   where the plurality of class D amplifiers is electrically coupled in parallel to the MRI RF coil with the plurality of transmission lines.

12. The digital RF current source of claim 11, where the ADC adjusts the range and reference based, at least in part, on the negative maximum amplitude of the dithered RF input signal or the positive maximum amplitude of the dithered RF input signal.

13. The digital RF current source of claim 11, where a member of the plurality of class D amplifiers, upon receiving a digital input having a first value, is controlled to enter a first position.

14. The digital RF current source of claim 13, where the member of the plurality of class D amplifiers, upon being controlled to enter the first position, receives a positive DC voltage.

15. The digital RF current source of claim 11, where the member of the plurality of class D amplifiers, upon receiving a digital input having a second, different value, is controlled to enter a second, different position, and where the member of the plurality of class D amplifiers, upon being controlled to enter the second, different position, is connected to ground.

16. The digital RF current source of claim 15, where the member of the plurality of class D amplifiers, upon receiving a digital input having a third, different value, is controlled to enter a third, different position, and where the member of the plurality of class D amplifiers, upon being controlled to enter the third, different position, receives a negative DC voltage.

17. The digital RF current source of claim 11, where the length of a member of the plurality of transmission lines is one quarter wavelength ($\lambda/4$) of the RF signal or an odd integer multiple of $\lambda/4$ of the RF signal.

18. The digital RF current source of claim 17, where the length of a first member of the plurality of transmission lines is within a threshold of the length of a second member of the plurality of transmission lines, and where a phase delay between the plurality of class D amplifiers is a function of the length.

19. The digital RF current source of claim 11, where a member of the plurality of class D amplifiers comprises an ultrasound pulser integrated circuit configured to receive the digital input signal and to drive the MRI RF coil.

20. A radio frequency (RF) transmit system for a digital RF current source, the system comprising:
   a magnetic resonance imaging (MRI) system control console operably connected to a digital RF current source amplifier;
   where the digital RF current source amplifier is operably connected to an RF transmission coil;
   where the MRI system control console provides a digital control signal to the digital RF current source amplifier;
   where the MRI system control console provides a master RF current source clock signal to the digital RF current source amplifier; and
   where the digital RF current source amplifier provides an alternating current to the RF transmission coil.

21. The RF transmit system of claim 20, where the MRI system control console is operably connected to a plurality digital RF current source amplifiers.

22. The RF transmit system of claim 21, where the MRI system control console provides a plurality of control signals to the plurality of digital RF current source amplifiers; and where the MRI system control console provides a master RF clock to the plurality of RF current source amplifiers.

23. The RF transmit system of claim 22, where the MRI system control console and the plurality of digital RF current source amplifiers are operably coupled by a plurality of connection cables, where a member of the plurality of connection cables has a length.

24. The RF transmit system of claim 23, where a first member of the plurality of connection cables has a first length that is within a threshold tolerance of a length of a second, different member of the plurality of connection cables, and where a phase delay between the plurality of digital RF current source amplifiers is a function of the length of the members of the plurality of connection cables.

25. A radio frequency (RF) transmit system for a digital RF current source, the system comprising:

a magnetic resonance imaging (MRI) system control console operably connected to a console signal-to-bit pattern translator and a digital RF current source amplifier;

a memory component operably connected to the console signal-to-bit pattern translator, where the memory component stores a set of digital bit patterns, where the memory component is further operably connected to the digital RF current source amplifier;

where the MRI system control console provides a first control signal and a DC voltage to the console signal-to-bit pattern translator;

where the console signal-to-bit pattern translator converts the first control signal to a second control signal and provides the second control signal to the memory component;

where the memory component selects a bit pattern from the set of digital bit patterns based on the second control signal;

where the memory component provides the bit pattern to the digital RF current source amplifier; and where the MRI system control console provides a master RF current source clock signal to the digital RF current source amplifier.

26. The RF transmit system of claim 25 further comprising:
an RF transmission (Tx) coil operably connected to the digital RF current source amplifier.

27. The RF transmit system of claim 26, where digital RF current source amplifier is a class D amplifier.

28. The RF transmit system of claim 25, where the first control signal is an analog signal.

29. The RF transmit system of claim 25, where the first control signal is a digital signal.

30. The RF transmit system of claim 25, where the MRI system control console is operably connected to a plurality of console signal-to-bit pattern translators, and a plurality of digital RF current source amplifiers.

31. The RF transmit system of claim 30 further comprising:
a plurality of memory components respectively operably connected to the plurality of console signal-to-bit pattern translators, where a member of the plurality of memory components stores a set of digital bit patterns, where the member of the plurality of memory components is further respectively operably connected to the plurality of digital RF current source amplifiers.

32. The RF transmit system of claim 31, where the MRI system control console and the plurality of digital RF current source amplifiers are operably coupled by a plurality of connection cables.

33. The RF transmit system of claim 32, where the plurality of connection cables are within a threshold of the same length, and where a phase delay between the plurality of digital RF current source amplifiers is a function of the length of the connection cables.

34. The RF transmit system of claim 33, where the master RF current source clock signal synchronizes the phase among the plurality of digital RF current source amplifiers.

* * * * *